US008776685B2

(12) United States Patent
Nagao (10) Patent No.: US 8,776,685 B2
(45) Date of Patent: Jul. 15, 2014

(54) SCREEN PRINTING APPARATUS

(75) Inventor: Kazuhide Nagao, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/273,580

(22) Filed: Oct. 14, 2011

(65) Prior Publication Data

US 2012/0085254 A1    Apr. 12, 2012

Related U.S. Application Data

(63) Continuation of application No. 12/675,844, filed as application No. PCT/JP2008/066899 on Sep. 11, 2008.

(30) Foreign Application Priority Data

Sep. 11, 2007  (JP) ................................. 2007-234928

(51) Int. Cl.
*B05C 17/06* (2006.01)
(52) U.S. Cl.
USPC .......................................... 101/126; 101/123
(58) Field of Classification Search
USPC .......... 101/114, 123, 124, 126, 129, 479, 480
See application file for complete search history.

(56) References Cited

U.S. PATENT DOCUMENTS

| | | | |
|---|---|---|---|
| 5,730,051 A | | 3/1998 | Takahashi et al. |
| 5,873,939 A | | 2/1999 | Doyle et al. |
| 6,066,206 A | * | 5/2000 | Doyle et al. ................. 427/98.5 |
| 6,119,592 A | | 9/2000 | Nishikawa et al. |
| 6,202,551 B1 | | 3/2001 | Murakami |
| 6,207,220 B1 | | 3/2001 | Doyle et al. |
| 6,237,490 B1 | | 5/2001 | Takahashi et al. |
| 6,267,819 B1 | | 7/2001 | Doyle et al. |
| 6,663,712 B2 | * | 12/2003 | Doyle et al. .................. 118/301 |
| 7,219,787 B2 | * | 5/2007 | Kabeshita et al. ......... 198/346.2 |
| 2002/0007789 A1 | | 1/2002 | Doyle et al. |

(Continued)

FOREIGN PATENT DOCUMENTS

| | | |
|---|---|---|
| CN | 1843758 A | 10/2006 |
| JP | 4-129630 A | 4/1992 |

(Continued)

OTHER PUBLICATIONS

International Search Report for PCT/JP2008/066899.

(Continued)

*Primary Examiner* — Ren Yan
(74) *Attorney, Agent, or Firm* — Pearne & Gordon LLP (57) ABSTRACT

A screen printing apparatus including two screen printers, each including a substrate introduction portion by which a substrate is introduced from an upstream side of a component mounting line, a printing portion which performs a screen printing to the introduced substrate, a substrate discharge portion by which the substrate is discharged to a downstream side, and a substrate moving stage which receives the substrate to position the substrate with respect to the printing portion and to move the substrate to the substrate discharge portion. The two substrate introduction portions, the two printing portions, and the two substrate discharge portions are arranged symmetrically to each other with respect to a perpendicular symmetrical plane extending in a transportation direction of the substrate in the component mounting line, respectively. Each printing portion is provided at a position further from the perpendicular symmetrical plane than the substrate discharge portion.

2 Claims, 8 Drawing Sheets

(56) References Cited

U.S. PATENT DOCUMENTS

| | | |
|---|---|---|
| 2002/0019680 A1 | 2/2002 | Nishikawa et al. |
| 2002/0020346 A1 | 2/2002 | Doyle et al. |
| 2002/0178943 A1 | 12/2002 | Takahashi et al. |

FOREIGN PATENT DOCUMENTS

| | | | |
|---|---|---|---|
| JP | 04-236489 A | | 8/1992 |
| JP | 06-155706 A | | 6/1994 |
| JP | 2000-168040 A | | 6/2000 |
| JP | 2002-503161 A | | 1/2002 |
| JP | 2003-163499 A | | 6/2003 |
| JP | 2004-142299 A | | 5/2004 |
| JP | 2005081745 A | * | 3/2005 |
| JP | 2005-262689 A | | 9/2005 |
| JP | 2006-312304 A | | 11/2006 |
| JP | 2008-272964 A | | 11/2008 |

OTHER PUBLICATIONS

Chinese Office Action for Application No. 201110312216.8 dated Sep. 4, 2013.

* cited by examiner

SCREEN PRINTING APPARATUS

This application is a continuation of U.S. patent application Ser. No. 12/675,844 filed Mar. 1, 2010 which is incorporated herein by reference in its entirety.

BACKGROUND ART

The present invention relates to a screen printing apparatus which is mounted to a component mounting line to perform a screen printing to a substrate introduced from the upstream side and to discharge the substrate to the downstream side of the component mounting line.

A screen printing apparatus is mounted to a component mounting line together with a component mounting apparatus or an attachment apparatus to perform a screen printing using cream solder or conductive paste to a substrate introduced from the upstream side and to discharge the substrate to an apparatus provided on the downstream side of the component mounting line. In general, the screen printing apparatus is disposed on the upstream side of the component mounting apparatus and the substrate subjected to the screen printing is directly or indirectly transferred from a substrate discharge portion of the screen printing apparatus to a substrate transportation path of the component mounting apparatus. The component mounting apparatus mounts components to the substrate introduced from the screen printing apparatus, and discharges the substrate to an apparatus provided on the downstream side via the substrate transportation path.

Incidentally, among recent component mounting apparatuses, there is a component mounting apparatus in which two parallel substrate transportation paths are provided and the component mounting operation is simultaneously carried out by two component mounting lines via the two substrate transportation paths. Likewise, when the component mounting apparatus includes two substrate transportation paths, the substrate discharged from the substrate discharge portion of the screen printing apparatus is distributed to the two substrate transportation paths of the component mounting apparatus by a substrate distributing device provided between the component mounting apparatus and the screen printing apparatus (JP-A-H04-129630).

However, in the component mounting apparatus having the two component mounting lines, the component mounting operation may be carried out in the different types of substrates (including a case carried out in the same type of substrates but on different surfaces in addition to a case carried out the different types of the substrates) at the same time as well as the component mounting operation carried out in the same type of substrates. In this case, since the screen printing apparatus cannot continuously perform the screen printing to the different types of substrates, it is necessary to provide two screen printing apparatuses in parallel to each other at a position on the upstream side of the component mounting apparatus. However, since the interval between the two substrate transportation paths constituting the component mounting apparatus is very narrow, it is very difficult to provide two screen printing apparatuses in parallel so that the substrate discharge portions of the screen printing apparatuses are opposed to the two substrate transportation paths of the component mounting apparatus.

Additionally, instead of the above-described technique, it may be supposed that two types of mask plates are provided at a position above one substrate transportation path constituting the screen printing apparatus so as to be disposed in a line in a direction in which the substrate transportation path extends (JP-A-2000-168040), thereby performing the different types of screen printings to the substrate on the substrate transportation path. However, since the different types of masks are provided in serial to the one substrate transportation path of the screen printing apparatus, it is necessary to provide a complex substrate supply system to the substrate transportation path so as to supply the different substrates alternatively or once in several substrates.

DISCLOSURE OF THE INVENTION

Therefore, an object of the invention is to provide a screen printing apparatus capable of simultaneously performing the screen printing to the different types of substrates without the complex substrate supply system.

According to the first aspect of the invention, there is provided a screen printing apparatus mounted to a component mounting line, the apparatus comprising:

two screen printers each including a substrate introduction portion by which a substrate is introduced from an upstream side of the component mounting line;

a printing portion which performs a screen printing to the substrate introduced by the substrate introduction portion; a substrate discharge portion by which the substrate subjected to the screen printing by the printing portion is discharged to a downstream side of the component mounting line; and a substrate moving stage which receives the substrate introduced by the substrate introduction portion to position the substrate with respect to the printing portion and to move the substrate subjected to the screen printing by the printing portion to the substrate discharge portion, wherein the two substrate introduction portions, the two printing portions, and the two substrate discharge portions of the two screen printers are arranged symmetrically to each other with respect to a perpendicular symmetrical plane extending in a substrate transportation direction of the component mounting line, respectively, and wherein the printing portion of each screen printer is provided at a position further from the perpendicular symmetrical plane than the substrate discharge portion.

The second aspect of the invention provides the screen printing apparatus described in the first aspect of the invention, wherein the two substrate discharge portions are provided at a position opposed to two parallel substrate transportation paths formed in a component mounting apparatus provided on the downstream side of the component mounting line in the substrate transportation direction.

According to the invention, since the screen printing apparatus includes the two screen printers each including the substrate introduction portion, the printing portion, the substrate discharge portion, and the substrate moving stage so as to independently perform the screen printing, it is possible to simultaneously perform the screen printing to the different types of substrates. Additionally, even when the component mounting apparatus provided on the downstream side includes two substrate transportation paths, it is possible to transport the substrates subjected to the screen printing to the substrate transportation paths without a substrate distributing device.

Since the two substrate introduction portions, the two printing portions, and the two substrate discharge portions constituting the two screen printers are respectively formed at a position symmetrical to each other with respect to the perpendicular symmetrical plane extending in the substrate transportation direction in the component mounting line, it is easy to arrange the respective portions of the screen printers. Additionally, since each printing portion of the screen printers is provided at a position further from the perpendicular symmetrical plane than the substrate discharge portion, even when the interval between the two substrate discharge portions cannot be set to be narrow so as to correspond to the interval between the two substrate transportation paths constituting the component mounting apparatus as the apparatus provided on the downstream side, it is possible to arrange the two printing portions at a position symmetrical to each other so as not to interfere with each other.

Since the two screen printers are provided in parallel to each other and each includes the exclusive substrate introduction portion, when the screen printing is simultaneously performed to the different types of substrates, the type of the substrate may be changed between the two screen printers and the same type of substrate may be continuously supplied to each of the screen printers. Accordingly, unlike the conventional art, it is not necessary to provide such a complex substrate supply system that the different type substrates are supplied alternately or once in several other substrates.

BEST MODE FOR CARRYING OUT THE INVENTION

Figure 1:
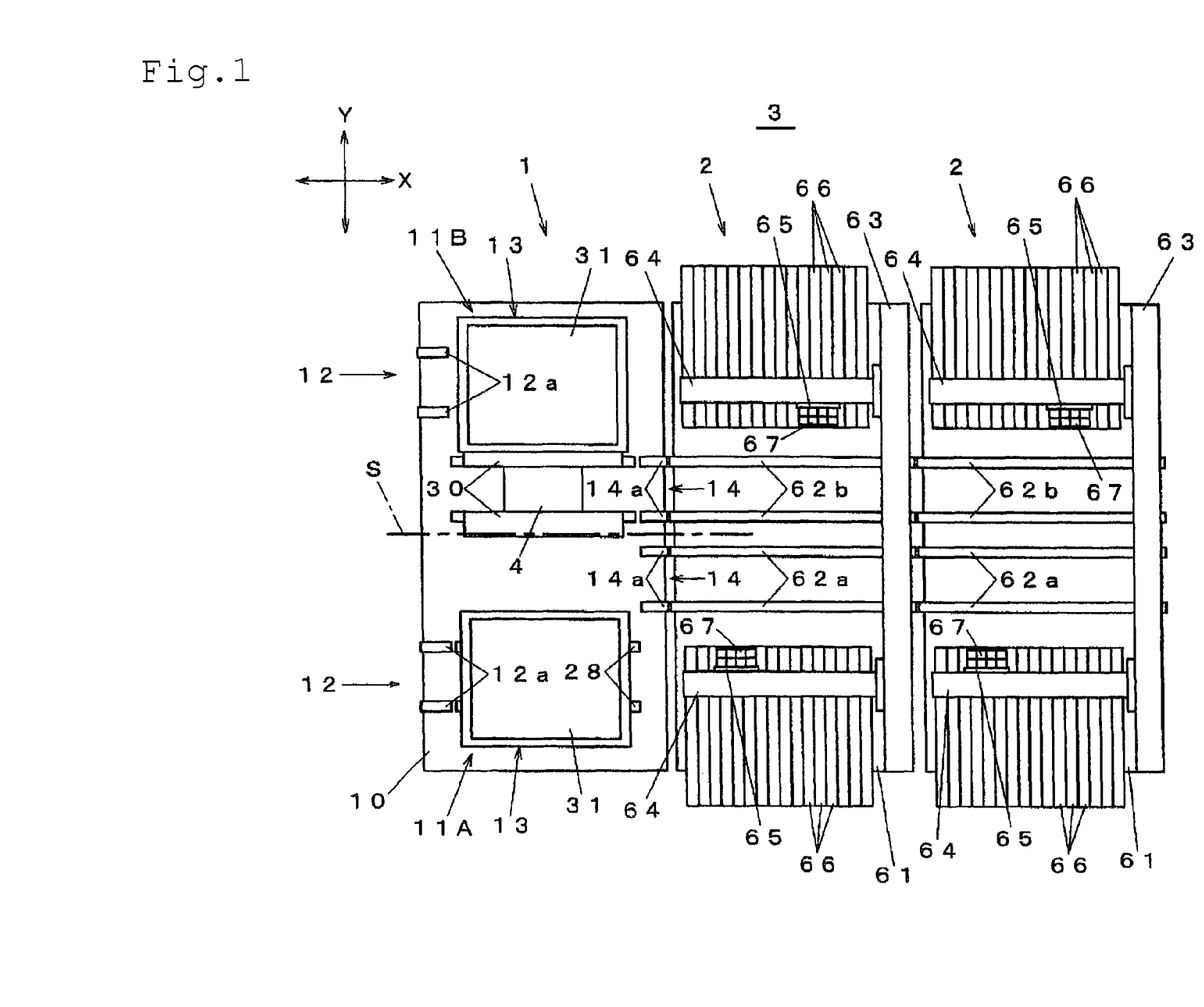
FIG. 1 is a top view showing a component mounting line according to an embodiment of the invention.
Figure 2:
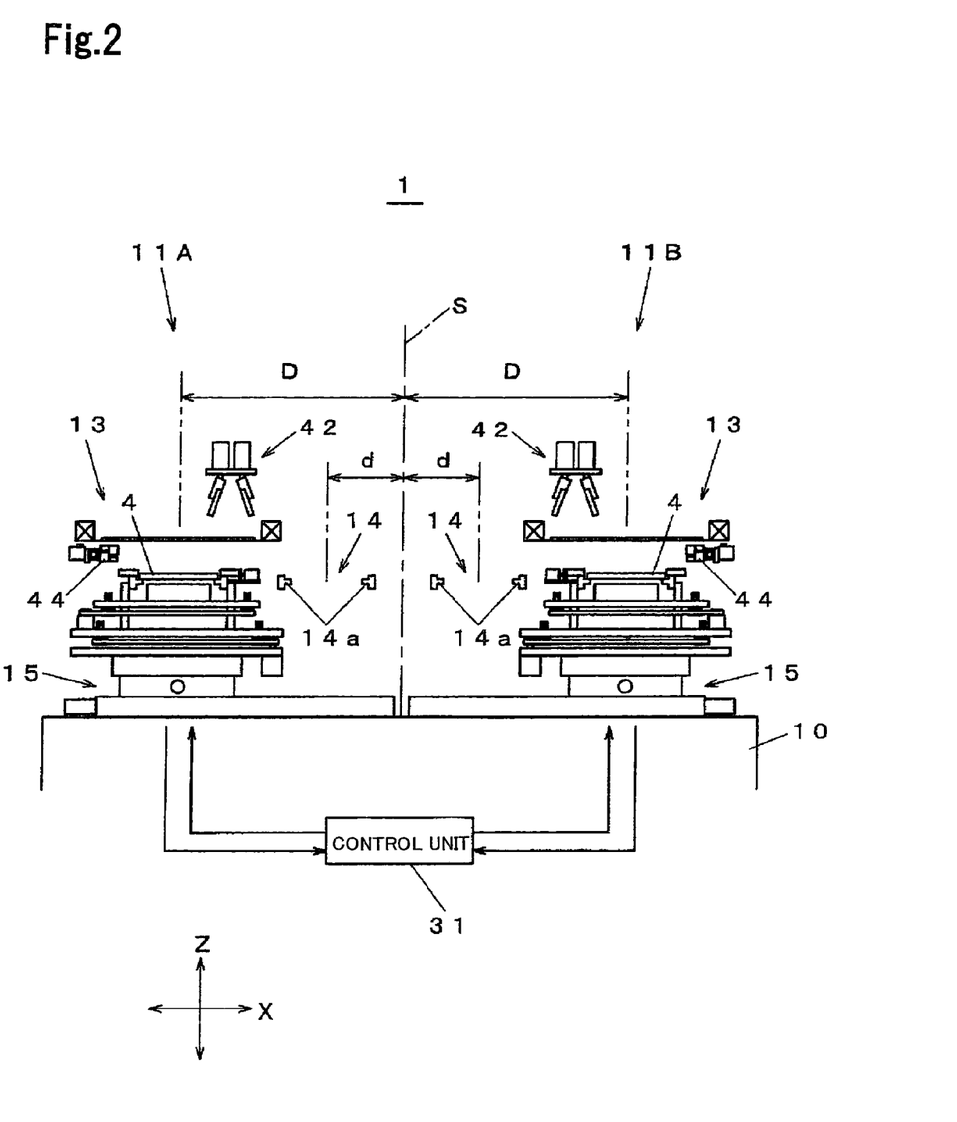
FIG. 2 is a front view showing a screen printing apparatus according to the embodiment of the invention.
Figure 3:
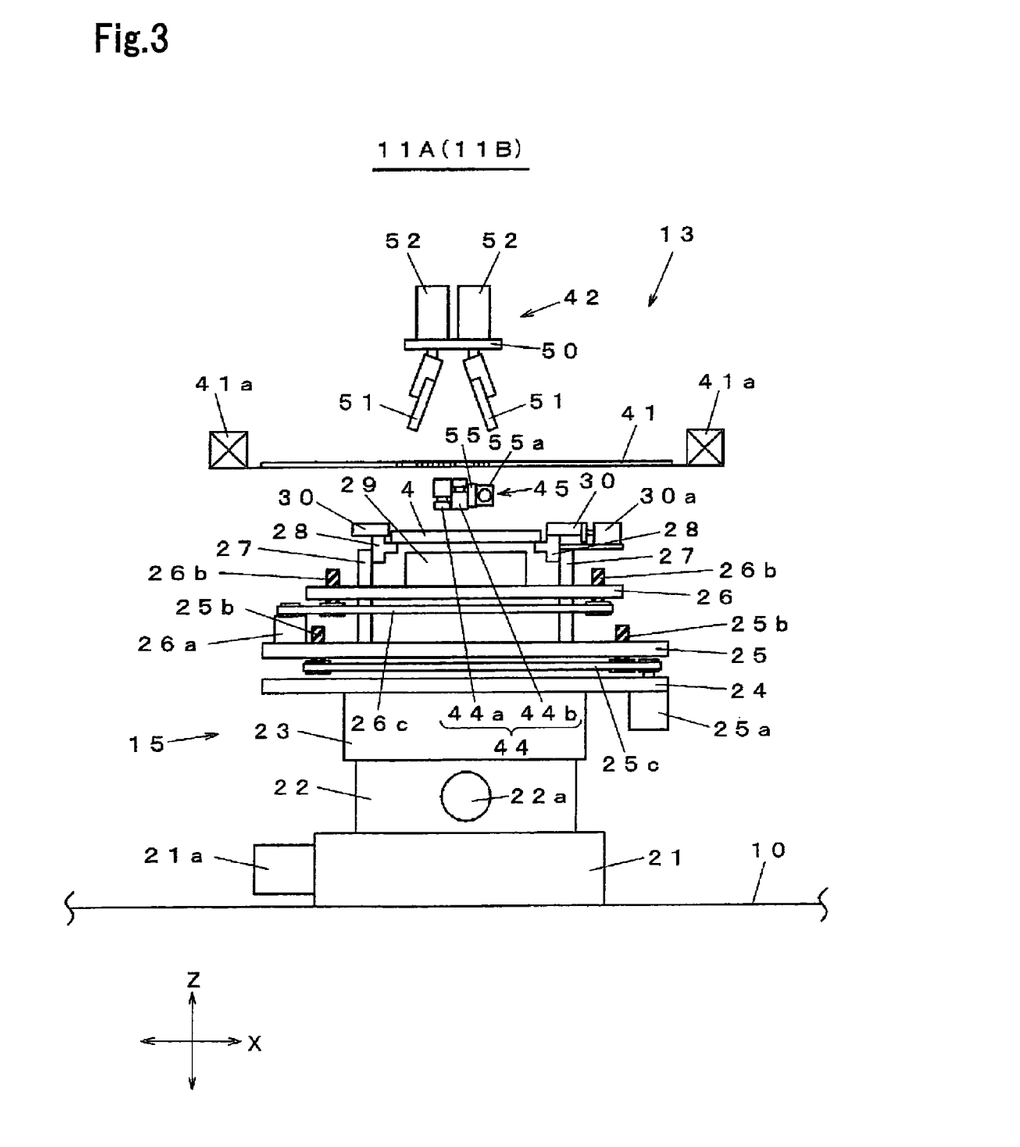
FIG. 3 is a front view showing a screen printer of the screen printing apparatus according to the embodiment of the invention.
Figure 4:
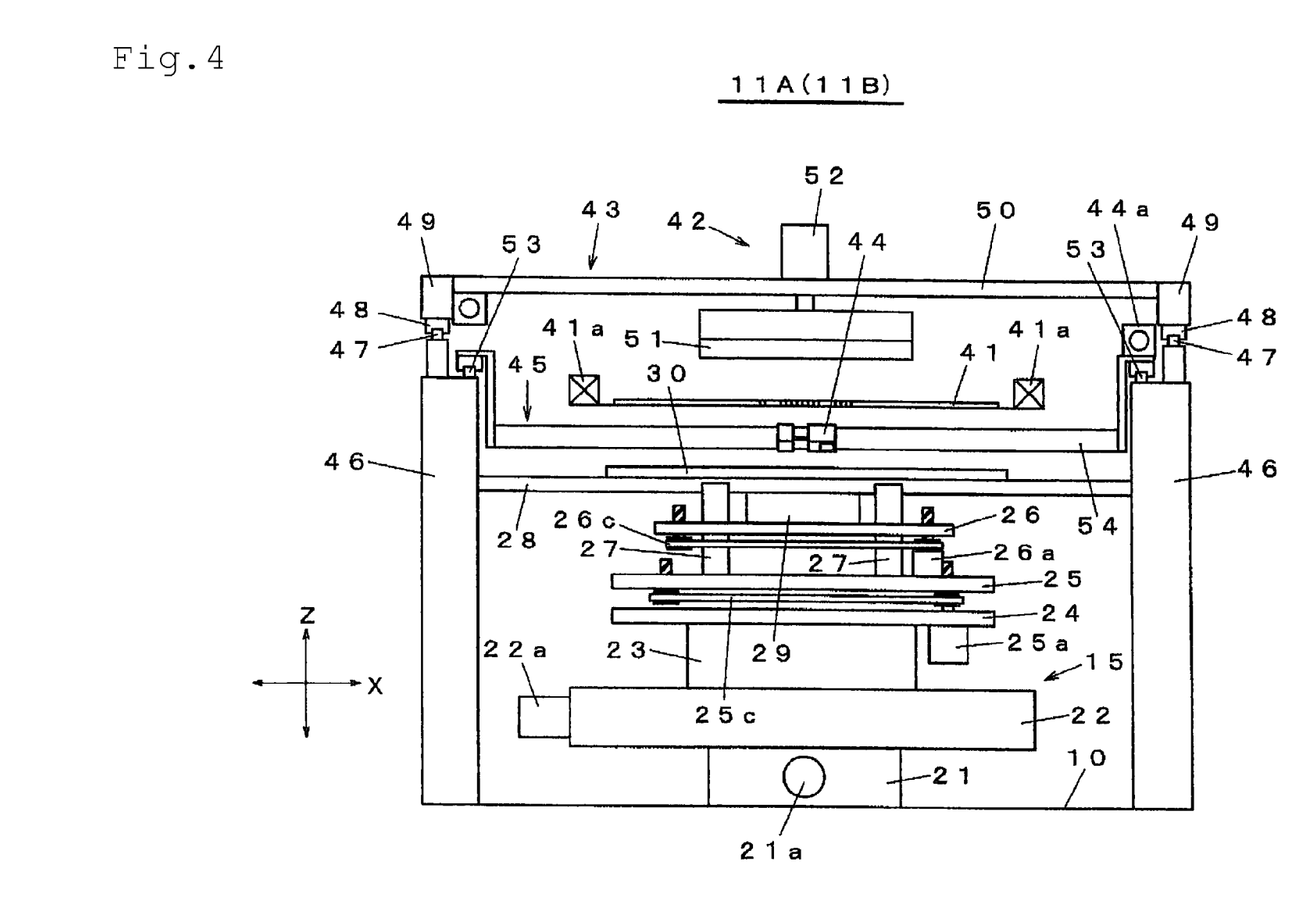
FIG. 4 is a side view showing the screen printer of the screen printing apparatus according to the embodiment of the invention.
Figure 5A:
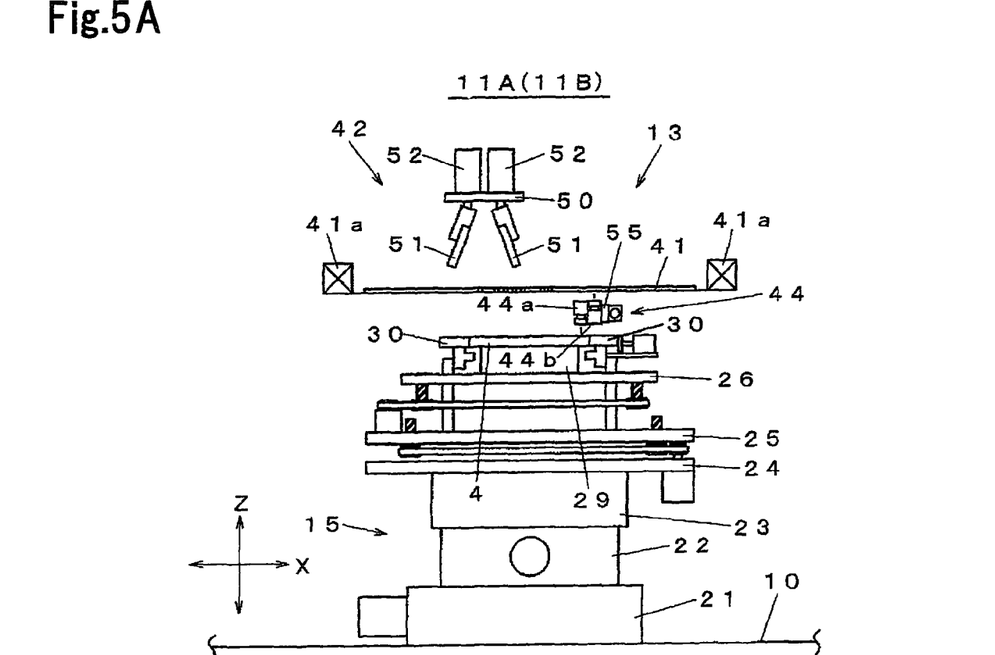
FIGS. 5A and 5B are explanatory views showing an operation of the screen printer of the screen printing apparatus according to the embodiment of the invention.
Figure 5B:
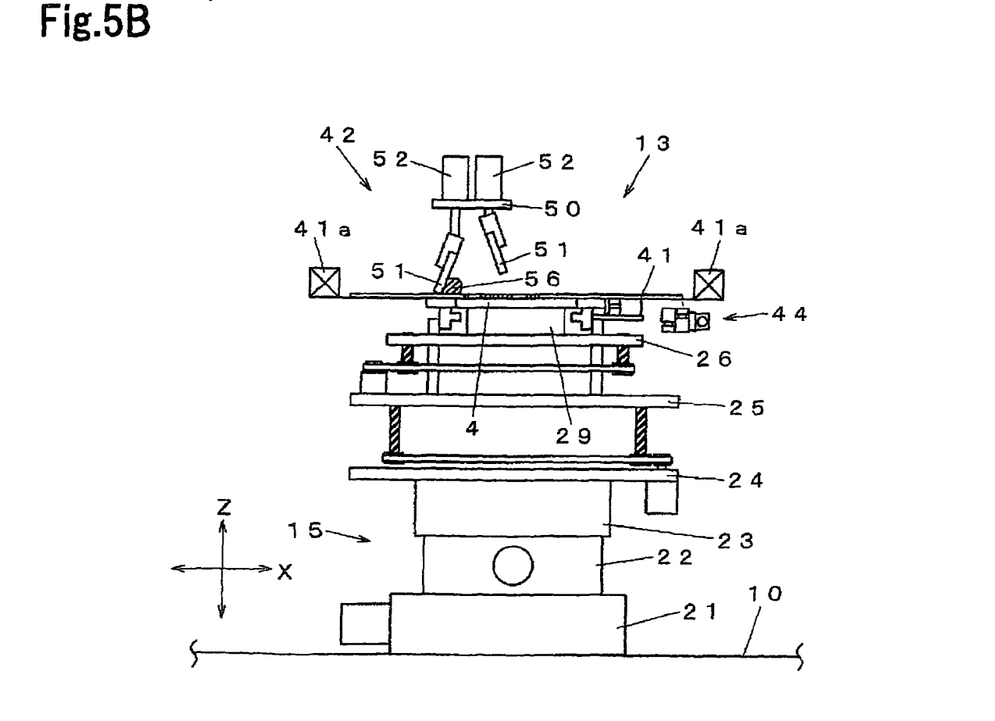

Hereinafter, an embodiment of the invention will be described with reference to the accompanying drawings. FIG. 1 is a top view showing a component mounting line according to an embodiment of the invention. FIG. 2 is a front view showing a screen printing apparatus according to the embodiment of the invention. FIG. 3 is a front view showing a screen printer of the screen printing apparatus according to the embodiment of the invention. FIG. 4 is a side view showing the screen printer of the screen printing apparatus according to the embodiment of the invention. FIGS. 5A and 5B are explanatory views showing an operation of the screen printer of the screen printing apparatus according to the embodiment of the invention. FIGS. 6A to 6F are explanatory views showing the operation of the screen printer of the screen printing apparatus according to the embodiment of the invention.

In FIG. 1, a screen printing apparatus 1 is mounted to a component mounting line 3 together with a plurality of component mounting apparatuses 2 or an attachment apparatus (not shown), and performs a screen printing to a substrate 4 introduced from the upstream side so as to subsequently discharge the substrate to the component mounting apparatuses 2 provided on the downstream side.

In FIGS. 1 and 2, the screen printing apparatus 1 includes two screen printers 11A and 11B provided on a base 10. Each of the two screen printing apparatuses 11A and 11B includes a substrate introduction portion 12 by which the substrate 4 is introduced from the upstream side of the component mounting line 3 onto the base 10, a printing portion 13 which performs a screen printing to the substrate 4 introduced by the substrate introduction portion 12 onto base 10, a substrate discharge portion 14 by which the substrate 4 subjected to the screen printing by the printing portion 13 is discharged to the downstream side of the component mounting line 3, and a substrate moving stage 15 which receives the substrate 4 introduced by the substrate introduction portion 12 to position the substrate 4 with respect to the printing portion 13 and to move the substrate 4 subjected to the screen printing by the printing portion 13 to the substrate discharge portion 14.

The substrate introduction portion 12 constituting each of the screen printers 11A and 11B is provided with a substrate introduction path 12a having two parallel transportation rails extending in a transportation direction (X-axis direction) of the substrate 4 in the component mounting line 3. The substrate discharge portion 14 constituting each of the screen printers 11A and 11B is provided with a substrate discharge path 14a having two parallel transportation rails extending in an X-axis direction in the same manner.

As shown in FIGS. 1 and 2, the two substrate introduction portions 12 (the substrate introduction paths 12a provided in the substrate introduction portion 12) and the two substrate discharge paths 14 (the substrate discharge paths 14a provided in the substrate discharge path 14) constituting the two screen printers 11A and 11B are respectively arranged symmetrically to each other with respect to a perpendicular symmetrical plane S extending in an X-axis direction corresponding to the transportation direction of the substrate 4 in the component mounting line 3. Additionally, the two printing portions 13 are arranged symmetrically to each other with respect to the perpendicular symmetrical plane S, and each horizontal distance D of the printing portions 13 from the perpendicular symmetrical plane S is set to be larger than each horizontal distance d of the substrate discharge portions 14 from the perpendicular symmetrical plane S (FIG. 2). That is, in the respective screen printers 11A and 11B, the printing portions 13 are positioned further from the perpendicular symmetrical plane S than the substrate discharge portions 14.

In FIGS. 3 and 4, the substrate moving stage 15 constituting each of the screen printers 11A and 11B includes an Y-axis stage 21 which is movable on the base in a horizontal direction (Y-axis direction) perpendicular to an X-axis direction, an X-axis stage 22 which is movable on the Y-axis stage 21 in an X-axis direction, a θ-stage 23 which is movable on the X-axis stage 22 in a circumferential direction of a vertical axis, a base plate 24 which is fixed to the upper surface of the θ-stage 23, a first elevation plate 25 which is elevatable with respect to the base plate 24, and a second elevation plate 26 which is elevatable with respect to the first elevation plate 25.

A plurality of guide members 27 is uprightly formed in the upper surface of the first elevation plate 25, and two parallel transportation rails 28 are supported to the upper end portions of the plurality of guide members 27 so as to extend in parallel in an X direction corresponding to the transportation direction of the substrate 4. A substrate support member 29 is provided in the upper surface of the second elevation plate 26, and a pair of clamp members 30 is provided above the two transportation rails 28. The two transportation rails 28 are provided at the same interval therebetween in the same manner as the two transportation rails constituting the substrate introduction path 12a and the two transportation rails constituting the substrate discharge paths 14a.

The Y-axis stage 21 is screwed to a feed screw (not shown) rotationally driven by a Y-axis stage driving motor 21a. When a control unit 31 provided in the base 10 controls the Y-axis stage driving motor 21a to rotate, the Y-axis stage 21 is moved by the feed screw in a Y-axis direction. The X-axis stage 22 is screwed to a feed screw (not shown) rotationally driven by an X-axis stage driving motor 22a. When the control unit 31 controls the X-axis stage driving motor 22a to rotate, the X-axis stage 22 is moved by the feed screw in an X-axis direction. The θ-stage 23 is connected to a θ-stage driving motor (not shown). When the control unit 31 controls the θ-stage driving motor to rotate, the θ-stage 23 rotates in a circumferential direction of the vertical axis.

In FIGS. 3 and 4, a first elevation motor 25a is fixed to the base plate 24, and a first feed screw 25b is screwed to the first elevation plate 25. A first belt 25c is suspended on a driving shaft of the first elevation motor 25a and the first feed screw 25b. When the control unit 31 controls the first elevation motor 25a to rotate, the first feed screw is rotated by the first belt 25c, and the first elevation plate 25 is elevated by the first feed screw 25b. Additionally, a second elevation motor 26a is fixed to the first elevation plate 25, and a second feed screw 26b is screwed to the second elevation plate 26. A second belt 26c is suspended on a driving shaft of the second elevation motor 26a and the second feed screw 26b. When the control unit 31 controls the second elevation motor 26a to rotate, the second feed screw 26b is rotated by the second belt 26c, and the second elevation plate 26 is elevated by the second feed screw 26b.

The clamp members 30 are connected to a clamp cylinder 30a fixed to one of the guide members 27. When the control unit 31 controls the clamp cylinder 30a to project or retract, the clamp members 30 on the transportation rails 28 are opened or closed in a Y-axis direction. Accordingly, when the second elevation plate 26 is elevated in a state where the substrate 4 is located at a position just above the substrate support member 29, and the clamp members 30 are closed to clamp the substrate 4 in a state where the substrate support member 29 comes into contact with the lower surface of the substrate 4, it is possible to fix the substrate 4 onto the transportation rails 28.

In FIGS. 3 and 4, the printing portion 13 includes a mask plate 41 which is provided above the substrate moving stage 15, a squeegee head 42 which is provided above the mask plate 41, a squeegee head moving mechanism 43 which moves the squeegee head 42 in a horizontal plane, a camera 44 which is provided between the substrate moving stage 15 and the mask plate 41, and a camera moving mechanism 45 which moves the camera 44 in a horizontal plane.

The four sides of the mask plate 41 are supported by a rectangular mask frame 41a so as to be horizontal at a position above the transportation rails 28. A plurality of pattern holes (not shown) is formed in the mask plate in accordance with the position or the shape of an electrode (not shown) of the substrate 4.

In FIG. 4, two vertical frames 46 are uprightly formed in the base 10 so as to be opposed to each other in an X-axis direction, and a first guide rail 47 is provided in each upper end portion of the vertical frames 46 so as to extend in a Y-axis direction. A block member 49, having a slider 48 formed on the lower surface, is provided in the pair of first guide rails 47 so as to be movable along the first guide rails 47 in a Y-axis direction. A movement plate 50 is suspended on the both block members 49 in an X-axis direction.

The squeegee head 42 is fixed to the center portion of the movement plate 50 in an X-axis direction so as to be movable at a position above the mask plate 41 together with the movement plate 50 in a Y-axis direction. In FIGS. 3 and 4, the squeegee head 42 includes a pair of squeegees which extends in an X-axis direction so as to be opposed to each other in a Y-axis direction and a squeegee elevating cylinder 52 which elevates each squeegee 51. The control unit 31 controls the operation of the squeegee elevating cylinder 52.

The squeegee head moving mechanism 43 includes the vertical frames 46, the first guide rails 47, the sliders 48, the block members 49, and the movement plate 50. The movement plate 50 is screwed to a feed screw (not shown) rotationally driven by a squeegee head moving motor (not shown). When the control unit 31 controls the squeegee head moving motor to rotate, the movement plate 50 on the first guide rails 47 is moved by the feed screw in a Y-axis direction. Accordingly, it is possible to reciprocate the squeegees 51 mounted to the squeegee head 42 in a Y-axis direction.

In FIG. 4, the camera moving mechanism 45 includes two second guide rails 53 which are provided in the upper end portions of the two vertical frames 46 so as to extend in a Y-axis direction, a camera holding stage 54 which is suspended on the two second guide rails 53 so as to extend in an X-axis direction at a position between the transportation rails 28 and the mask plate 41 and to be movable along the two second guide rails 53 in a Y-axis direction, and a camera stage 55 (FIG. 3) which is movable along the camera holding stage 54 in an X-axis direction. The camera 44 is attached to the camera stage 55.

As shown in FIG. 3, the camera 44 includes a substrate recognizing camera 44a of which an imaging surface faces the downside and a mask recognizing camera 44b of which an imaging surface faces the upside. The control unit 31 controls the operation of the substrate recognizing camera 44a and the mask recognizing camera 44b. The imaging result obtained by the substrate recognizing camera 44a and the mask recognizing camera 44b is input to the control unit 31.

The camera holding stage 54 is screwed to a feed screw (not shown) rotationally driven by a camera holding stage moving motor (not shown). When the control unit 31 controls the camera holding stage moving motor to rotate, the camera holding stage 54 is moved by the feed screw in a Y-axis direction. Additionally, the camera stage 55 is screwed to a feed screw (not shown) rotationally driven by a camera stage moving motor 55a (FIG. 3). When the control unit 31 controls the camera stage moving motor 55a to rotate, the camera stage 55 is moved by the feed screw in an X-axis direction. Accordingly, it is possible to move the camera stage 55 in a horizontal plane.

Next, a sequence of the screen printing which is performed to the substrate 4 by the screen printers 11A and 11B will be described with reference to FIGS. 5A and 5B. When the substrate 4 is introduced from the apparatus provided on the upstream side of the screen printing apparatus 1 in the component mounting line 3 to the substrate introduction portion 12 of the screen printer 11A (or 11B), the control unit 31 controls the operation of the substrate introduction path 12a provided in the substrate introduction portion 12 so that the substrate 4 is introduced to the base 10 and the substrate 4 is again loaded from the substrate introduction path 12a onto the transportation rails 28 of the substrate moving stage 15. When the substrate 4 is loaded again on the transportation rails 28, the control unit 31 controls the operation of the transportation rails 28 so that the substrate 4 is introduced to a position just above the substrate support member 29 and the substrate 4 is clamped on the transportation rails 28 in the above-described sequences (FIG. 5A). Then, the camera stage 55 is moved in a horizontal plane so that the position of the substrate 4 is recognized by the substrate recognizing camera 44a and the position of the mask plate 41 is recognized by the mask recognizing camera 44b. Also, the Y-axis stage 21, the X-axis stage 22, and the θ-stage 23 are moved so that the clamped substrate 4 is positioned with respect to a predetermined position just below the mask plate 41.

When the positioning operation of the substrate 4 ends, the control unit 31 elevates the first elevation plate 25 with respect to the base plate 24 so that the upper surface of the substrate 4 comes into contact with the lower surface of the mask plate 41 and paste 56 such as cream solder or conductive paste is supplied from a dispenser (not shown) to the upper surface of the mask plate 41. Then, one squeegee elevating cylinder 52 extends downward so that the lower edge of the squeegee 51 attached to the squeegee elevating cylinder 52 comes into contact with the upper surface of the mask plate 41.

When the lower edge of the squeegee 51 comes into contact with the upper surface of the mask plate 41, the control unit 31 operates the squeegee head moving mechanism 43 so that the whole portion of the movement plate 50 is moved in a direction (Y-axis direction) parallel to a direction of the substrate 4 and the paste 56 is collected by the squeegee 51 in a scraping manner, thereby transferring the paste 56 to electrodes of the substrate 4 via the pattern hole of the mask plate 41 (FIG. 5B).

When the paste 56 is transferred to the substrate 4, the control unit 31 moves down the first elevation plate 25 with respect to the base plate 24 and moves the upper surface of the substrate 4 and the lower surface of the mask plate 41 to be away from each other. Then, the Y-axis stage 21 (the X-axis stage 22 and the θ-stage 23 depending on the case) is moved in a Y-axis direction so that the transportation rails 28 are positioned with respect to the substrate discharge path 14a. Accordingly, the substrate 4 is moved to the substrate discharge portion 14.

When the substrate 4 is moved to the substrate discharge portion 14, the control unit 31 opens the clamp members 30 so that the operation of the transportation rails 28 and the substrate discharge path 14a is controlled to transport the substrate 4 from the substrate discharge portion 14 to the component mounting apparatuses on the downstream side. Accordingly, the screen printing performed to the substrate 4 by the screen printers 11A and 11B ends.

Here, a configuration of each component mounting apparatus 2 will be simply described. As shown in FIG. 1, the component mounting apparatus 2 includes two substrate transportation paths 62a and 62b having two parallel transportation rails provided on a base 61 so as to extend in an X-axis direction, the two substrate transportation paths 62a and 62b being in parallel to each other. A Y-axis table 63 is provided in the base 61 so as to extend in a Y-axis direction, and two X-axis tables 64 are provided in the Y-axis table 63 so as to extend in an X-axis direction, one end portion being supported to the Y-axis table 63. A movement table 65 is provided in each X-axis table 64 so as to be movable along the X-axis table (in an X-axis direction).

Since each X-axis table 64 is movable along the Y-axis table 63 in a Y-axis direction and each movement table 65 is movable along the X-axis table 64 in an X-axis direction, each movement table 65 is capable of moving to an arbitrary position in the horizontal plane in terms of the combination of the movement operation of the X-axis table 64 and the self movement operation of the movement table 65. Additionally, a plurality of parts feeders 66 are provided on both sides of the base 61 in a Y-axis direction so as to be arranged in an X-axis direction.

Each movement table 65 is provided with a transfer head 67 having a plurality of adsorption nozzles (not shown) extending downward. In terms of the movement of the movement table 65 and the adsorption operation of the adsorption nozzles, the components (not shown) are picked up from the parts feeder 66 and the components (not shown) are loaded onto the substrate 4 which is introduced from the screen printing apparatus 1 to the substrate transportation paths 62a and 62b to be thereby positioned with respect to a predetermined position thereon. Then, after ending the operation in which the components are loaded on the substrate 4, the substrate 4 is introduced to an apparatus provided on the downstream side via the substrate transportation paths 62a and 62b.

Here, the two substrate discharge paths 14a constituting the screen printing apparatus 1 are provided at a position opposed to the two substrate transportation paths 62a and 62b constituting the component mounting apparatus 2 in the transportation direction (X-axis direction). That is, the interval between the two substrate discharge portions 14 of the screen printing apparatus 1 is set so as to correspond to the interval between the two substrate transportation paths 62a and 62b constituting the component mounting apparatus 2 provided on the downstream side.

Next, a sequence in which the screen printing is simultaneously performed to different types (two types) of substrates (denoted by reference numerals 4a and 4b) by the screen printing apparatus 1 according to this embodiment will be described with reference to FIGS. 6A to 6F. Here, an example of "different types" includes a case in which the same type of substrate 4 has different surfaces in addition to a case in which the type of the substrate 4 is different.

Figure 6A:
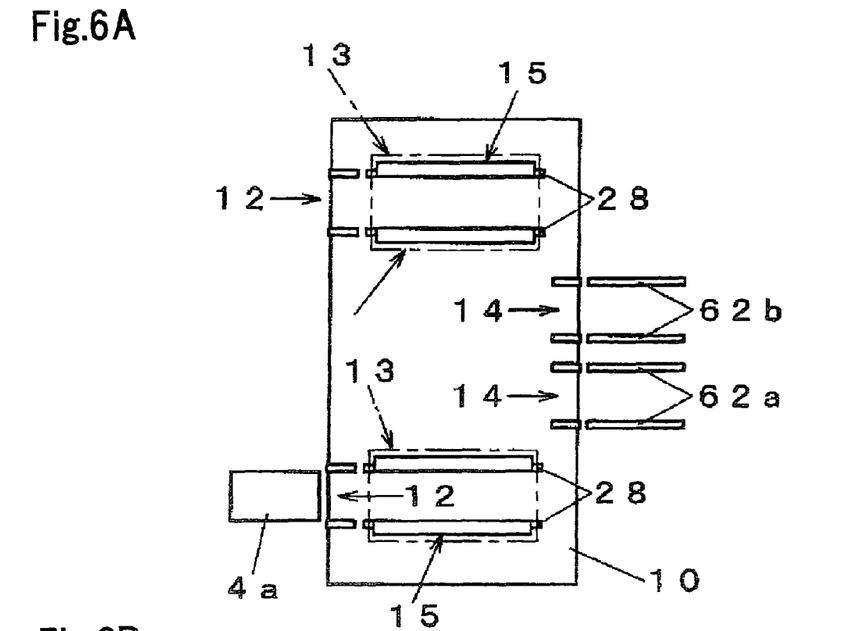
FIGS. 6A to 6F are explanatory views showing the operation of the screen printer of the screen printing apparatus according to the embodiment of the invention.
Figure 6B:
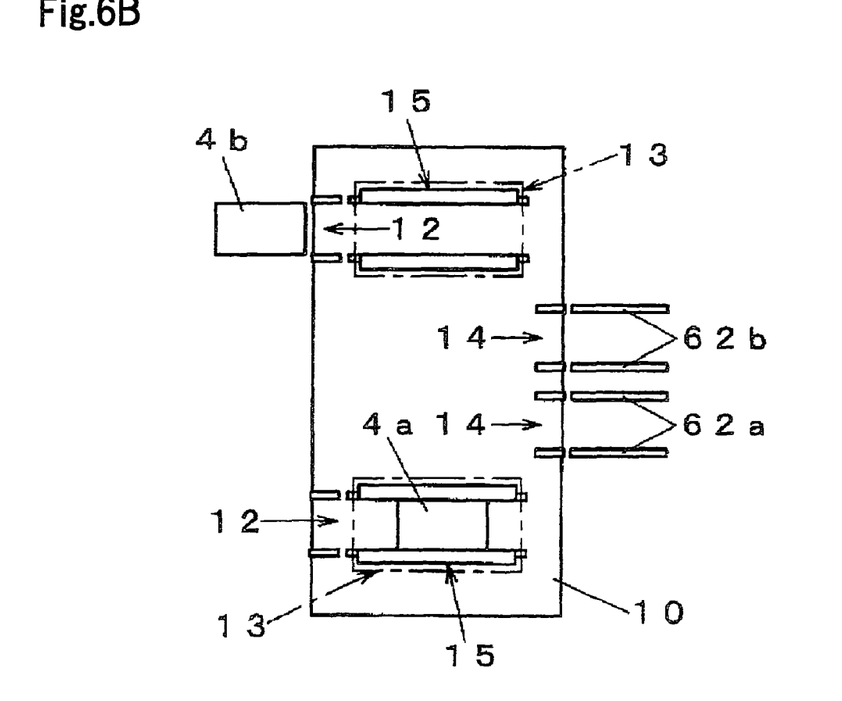

When the substrate 4a is introduced from the apparatus provided on the upstream side of the screen printing apparatus 1 in the component mounting line 3 to the substrate introduction portion 12 of the screen printer 11A, the control unit 31 loads again the substrate 4a onto the transportation rails 28 of the substrate movement stage 15 so as to be positioned with respect to the printing portion 13, thereby performing the screen printing to the substrate 4a (FIGS. 6A and 6B).

Figure 6C:
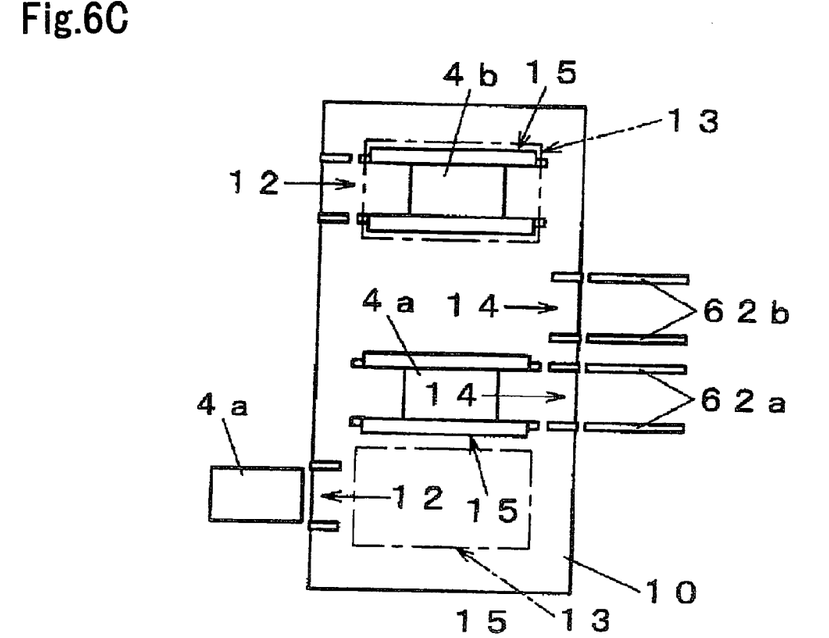
Figure 6D:
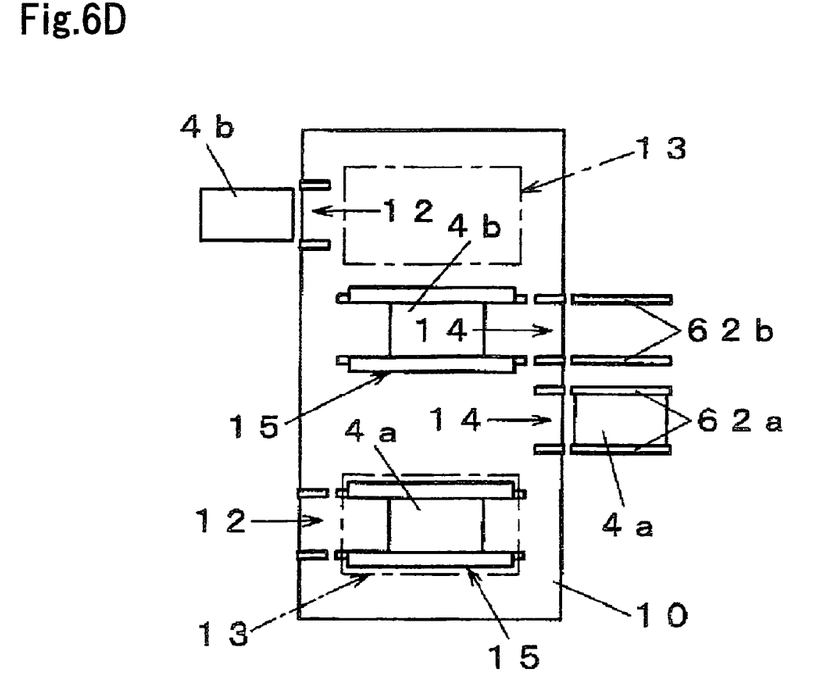

When ending the screen printing performed to the substrate 4a by the screen printer 11A, the control unit operates the substrate moving stage 15 of the screen printer 11A so that the substrate 4a is moved to the substrate discharge portion 14 (FIG. 6C) and the substrate 4a is discharged from the substrate discharge portion 14 (FIG. 6D). The substrate 4a discharged from the substrate discharge portion 14 of the screen printer 11A is transferred to the substrate transportation path 62a opposed to the substrate discharge portion 14 of the screen printer 11A, among the two substrate transportation paths 62a and 62b constituting the component mounting apparatus 2 on the downstream side.

On the other hand, for the mean time, in the screen printer 11B, the substrate 4b introduced by the substrate introduction portion 12 is loaded again onto the transportation rails 28 of the substrate moving stage 15 so as to be positioned with respect to the printing portion 13, thereby performing the screen printing to the substrate 4b (FIGS. 6B and 6C).

Figure 6E:
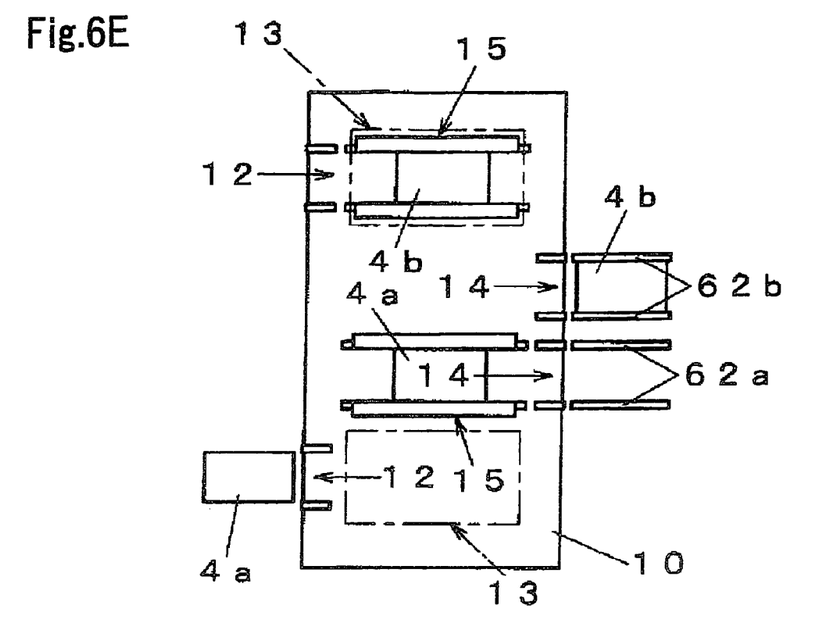

When ending the screen printing performed to the substrate 4b by the screen printer 11B, the control unit 31 operates the substrate moving stage 15 of the screen printer 11B so that the substrate 4b is moved to the substrate discharge portion 14 (FIG. 6D) and the substrate 4b is discharged from the substrate discharge portion 14 (FIG. 6E). The substrate 4b discharged from the substrate discharge portion 14 of the screen printer 11B is transferred to the substrate transportation path 62a opposed to the substrate discharge portion 14 of the screen printer 11B, among the two substrate transportation paths 62a and 62b constituting the component mounting apparatus 2 on the downstream side.

Figure 6F:
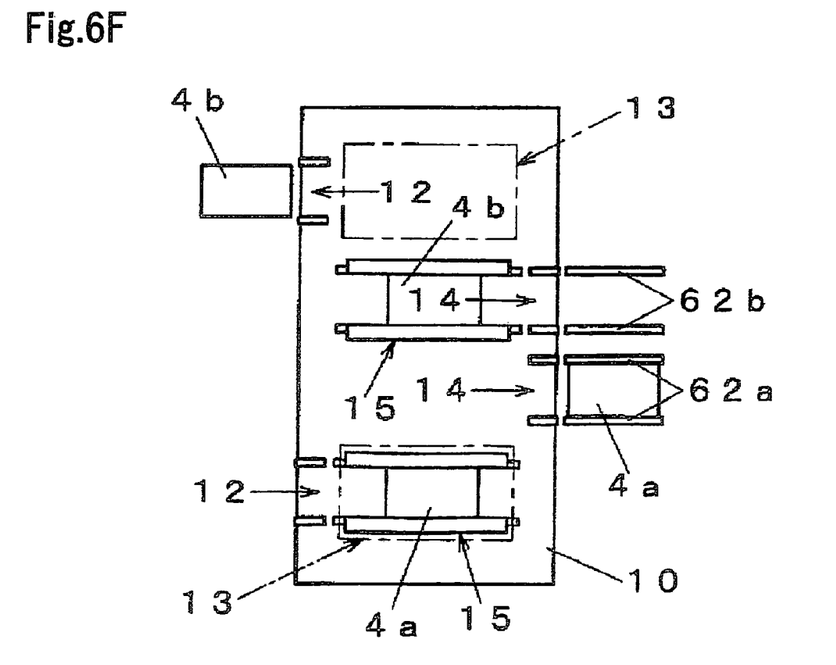

For the mean time, in the screen printer 11A, the substrate 4a introduced by the substrate introduction portion 12 is loaded again onto the transportation rails 28 of the substrate moving stage 15 so as to be positioned with respect to the printing portion 13, thereby performing the screen printing to the substrate 4a (FIGS. 6C and 6D). Then, when ending the screen printing performed to the substrate 4a, the substrate moving stage 15 of the screen printer 11A is operated so that the substrate 4a is moved to the substrate discharge portion 14 (FIG. 6E) and the substrate 4a is discharged from the substrate discharge portion 14 (FIG. 6F). Hereinafter, by repeatedly performing the above-described operations, it is possible to simultaneously perform the screen printing to the different types of substrates 4a and 4b.

As described above, since the screen printing apparatus 1 according to this embodiment includes the two screen printers (the screen printers 11A and 11B) each including the substrate introduction portion 12, the printing portion 13, the substrate discharge portion 14, and the substrate moving stage 15 so as to independently perform the screen printing, it is possible to simultaneously perform the screen printing to the different types of substrates. Like this embodiment, even when the component mounting apparatus 2 on the downstream side includes two substrate transportation paths 62a and 62b, it is possible to transport the substrate 4 (substrates 4a and 4b) subjected to the screen printing to the substrate transportation paths 62a and 62b without a substrate distributing device.

Since the two substrate introduction portions 12, the two printing portions 13, and the two substrate discharge portions 14 constituting the two screen printers 11A and 11B are respectively formed at a position symmetrical to each other with respect to the perpendicular symmetrical plane S extending in the transportation direction (X-axis direction) of the substrate 4 in the component mounting line 3, it is easy to arrange the respective portions of the screen printers 11A and 11B. Additionally, since each printing portion 13 of the screen printers 11A and 11B is provided at a position further from the perpendicular symmetrical plane S than the substrate discharge portion 14, even when the interval between the two substrate discharge portions 14 cannot be set to be narrow so as to correspond to the interval between the two substrate transportation paths 62a and 62b constituting the component mounting apparatus 2 as the apparatus provided on the downstream side, it is possible to arrange the two printing portions 13 at a position symmetrical to each other so as not to interfere with each other.

Since the two screen printers 11A and 11B are provided in parallel to each other and each includes the exclusive substrate introduction portion 12, when the screen printing is simultaneously performed to the different types of substrates 4, the type of the substrate 4 may be changed between the two screen printers 11A and 11B and the same type of substrate 4 may be continuously supplied to each of the screen printers 11A and 11B. Accordingly, unlike the conventional art, it is not necessary to provide a complex substrate supply system in which the different types of substrates are supplied alternately or at intervals.

While the exemplary embodiment of the invention has been described, the invention is not limited to the above-described embodiment. For example, although the above-described embodiment has a configuration in which the substrate 4 discharged from the two substrate discharge portions 14 constituting the screen printing apparatus 1 is directly transferred to the two substrate transportation paths 62a and 62b constituting the downstream component mounting apparatus 2, the substrate 4 may be indirectly transferred between the screen printing apparatus 1 and the component mounting apparatus 2 by providing an additional substrate transportation path between the screen printing apparatus 1 and the component mounting apparatus 2.

Further, by allowing the additional substrate transportation path to be movable in a Y-axis direction, it is possible to selectively distribute the substrate 4, discharged from one of the two substrate discharge portions 14 of the screen printing apparatus 1, to one of the two substrate transportation paths 62a and 62b of the component mounting apparatus 1.

Furthermore, although the above-described embodiment has a configuration in which the substrate introduction portion 12 is provided with the substrate introduction path 12a having two parallel transportation rails and the substrate discharge portion 14 is provided with the substrate discharge path 14a having two parallel transportation rails, when the two transportation rails 28 constituting the substrate moving stage 15 extend in the transportation direction (X-axis direction) of the substrate 4 in the component mounting line 3, the transportation rails 28 of the substrate moving stage 15 may serve as the substrate introduction path 12a and the substrate discharge path 14a. Accordingly, in such a configuration, it is not necessary to provide the substrate introduction path 12a and the substrate discharge path 14a.

It is possible to provide the screen printing apparatus capable of simultaneously performing the screen printing to the different types of substrates without the complex substrate supply system.

The invention claimed is:
1. A component mounting line in which a component mounting apparatus having two substrate transportation paths is connected with a downstream side of a screen printing apparatus, wherein the screen printing apparatus comprises:
two printing portions that perform a screen printing, and that are arranged symmetrically to each other with respect to a perpendicular symmetrical plane extending in a transportation direction of a substrate in the component mounting line; and
substrate moving stages that are provided so as to respectively correspond to the two printing portions, and which receive the substrate from an upstream side so as to position the substrate with respect to the respective printing portions and to move the substrate subjected to the screen printing by the respective portions to a downstream side;
wherein respective transportation rails provided with the substrate moving stages include two substrate introduction portions by which the substrate is introduced from an upstream side of the component mounting line, and two substrate discharge portions by which the substrate subjected to the screen printing by the respective printing portions is discharged to a downstream side of the component mounting line; and
when ending the screen printing performed to the substrate by the respective printing portions, the substrate is moved from the respective printing portions to the respective substrate discharge portions at one of two different discharging positions by the respective substrate moving stages, wherein the two different discharging positions are separate from the perpendicular symmetrical plane and all parts of the two substrate discharge portions are positioned closer to the perpendicular symmetrical plane than the respective printing portions;
the substrate discharged from one of two substrate moving stages of the screen printing apparatus is distributed to one of the two substrate transportation paths of the component mounting apparatus.

2. A component mounting method in a component mounting line in which a component mounting apparatus having two substrate transportation paths is connected with a downstream side of a screen printing apparatus, wherein the screen printing apparatus comprises two printing portions that perform a screen printing, and that are arranged symmetrically to each other with respect to a perpendicular symmetrical plane extending in a transportation direction of a substrate in the component mounting line, and substrate moving stages that are provided so as to respectively correspond to the two printing portions, and which receive the substrate from an upstream side so as to position the substrate with respect to the respective printing portions and to move the substrate subjected to the screen printing by the respective printing portions to a downstream side, wherein respective transportation rails provided with the substrate moving stages serve as a substrate introduction portion by which the substrate is introduced from an upstream side of the component mounting line, and a substrate discharge portion by which the substrate subjected to the screen printing by the respective printing portions is discharged to a downstream side of the component mounting line;

the method comprising: performing screen printing to the substrate by the respective printing portions, moving the printed substrate from the respective printing portions to the respective substrate discharge portions at one of two different discharging positions by the respective substrate moving stages, wherein the two different discharging positions are separate from the perpendicular symmetrical plane and all parts of the two substrate discharge portions are positioned closer to the perpendicular symmetrical plane than the respective printing portions;

the substrate discharged from one of two substrate moving stages of the screen printing apparatus is distributed to one of the two substrate transportation paths of the component mounting apparatus.

* * * * *